(12) United States Patent
Ikeda et al.

(10) Patent No.: US 11,705,310 B2
(45) Date of Patent: Jul. 18, 2023

(54) PLASMA PROBE DEVICE, PLASMA PROCESSING APPARATUS, AND CONTROL METHOD

(71) Applicant: TOYO ELECTRON LIMITED, Tokyo (JP)

(72) Inventors: Taro Ikeda, Nirasaki (JP); Mikio Sato, Nirasaki (JP); Eiki Kamata, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 124 days.

(21) Appl. No.: 17/006,201

(22) Filed: Aug. 28, 2020

(65) Prior Publication Data
US 2021/0074516 A1 Mar. 11, 2021

(30) Foreign Application Priority Data
Sep. 5, 2019 (JP) ................................. 2019-162336

(51) Int. Cl.
*H01J 37/32* (2006.01)
*G01R 1/07* (2006.01)

(52) U.S. Cl.
CPC .. *H01J 37/32449* (2013.01); *H01J 37/32935* (2013.01); *G01R 1/07* (2013.01)

(58) Field of Classification Search
CPC .......... H01J 37/32449; H01J 37/32935; H01J 37/3222; H01J 37/32513; H01J 37/32532; G01R 1/07; H05H 1/0006; H05H 1/0025
See application file for complete search history.

(56) References Cited

U.S. PATENT DOCUMENTS

| | | | |
|---|---|---|---|
| 2004/0184028 A1 | 9/2004 | Fink et al. | |
| 2015/0243491 A1* | 8/2015 | Ito | H01J 61/526 315/261 |
| 2018/0301387 A1* | 10/2018 | Ikeda | C23C 16/45508 |
| 2019/0074166 A1* | 3/2019 | Ikeda | H01J 37/32935 |
| 2021/0035788 A1* | 2/2021 | Ikeda | H01J 37/32192 |

FOREIGN PATENT DOCUMENTS

| | | |
|---|---|---|
| JP | 2016-207915 A | 12/2016 |
| KR | 1020100004065 A | 1/2010 |
| KR | 1020190026619 A | 3/2019 |

\* cited by examiner

*Primary Examiner* — Alvaro E Fortich
*Assistant Examiner* — Zannatul Ferdous
(74) *Attorney, Agent, or Firm* — Nath, Goldberg & Meyer; Jerald L. Meyer; Tanya E. Harkins

(57) ABSTRACT

A plasma probe device includes: an antenna installed in an opening portion formed in a wall of a processing container via a seal member that seals between a vacuum space and an atmospheric space; and a light transmission portion installed inside the antenna or forming at least a portion of the antenna, and configured to transmit emission of plasma generated in the vacuum space to the atmospheric space.

13 Claims, 14 Drawing Sheets

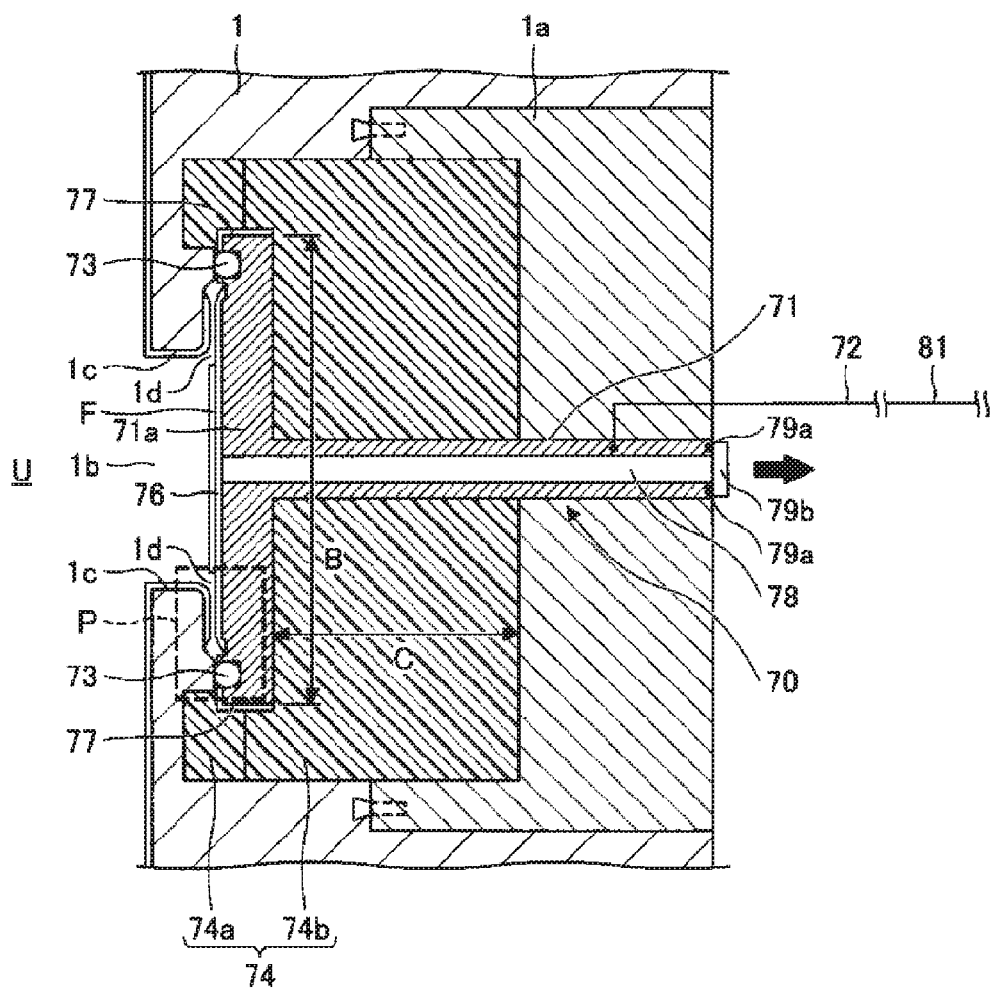

FIG. 5
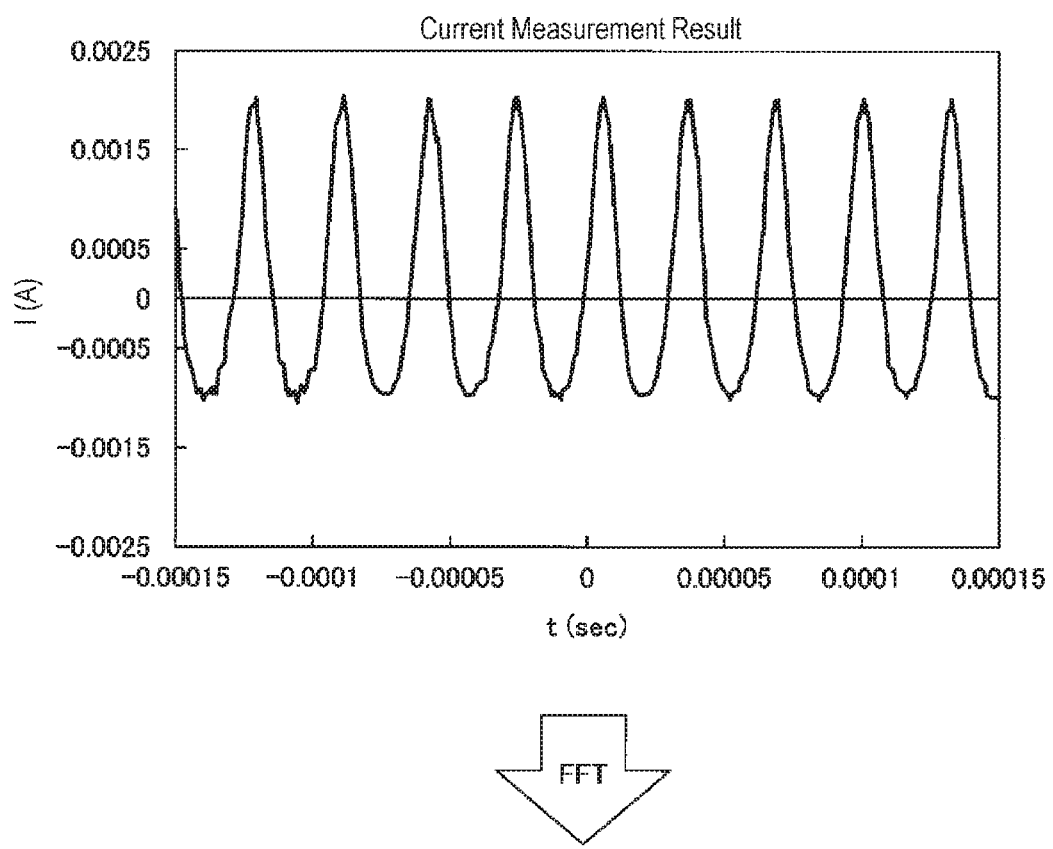
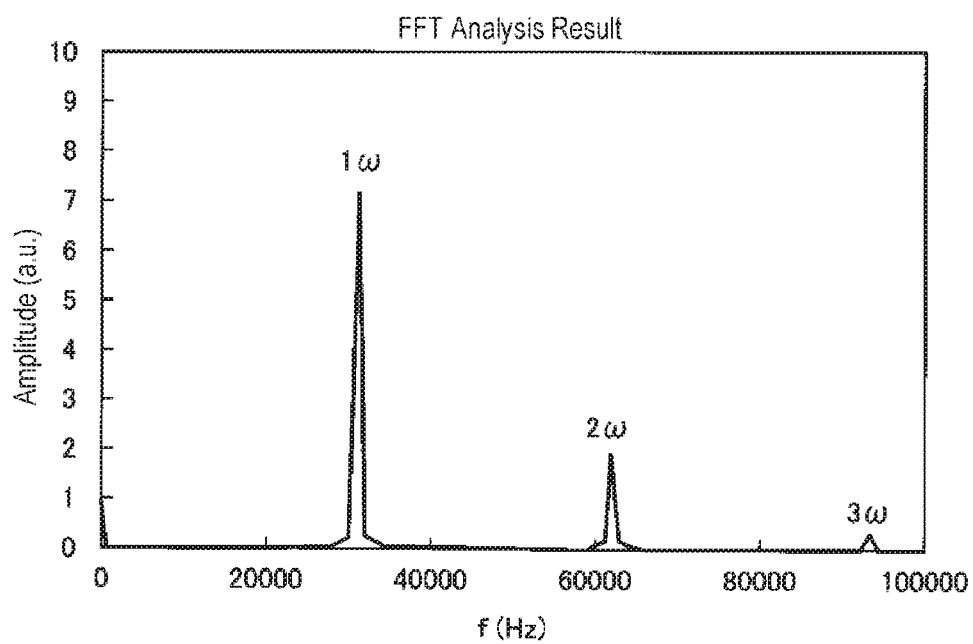

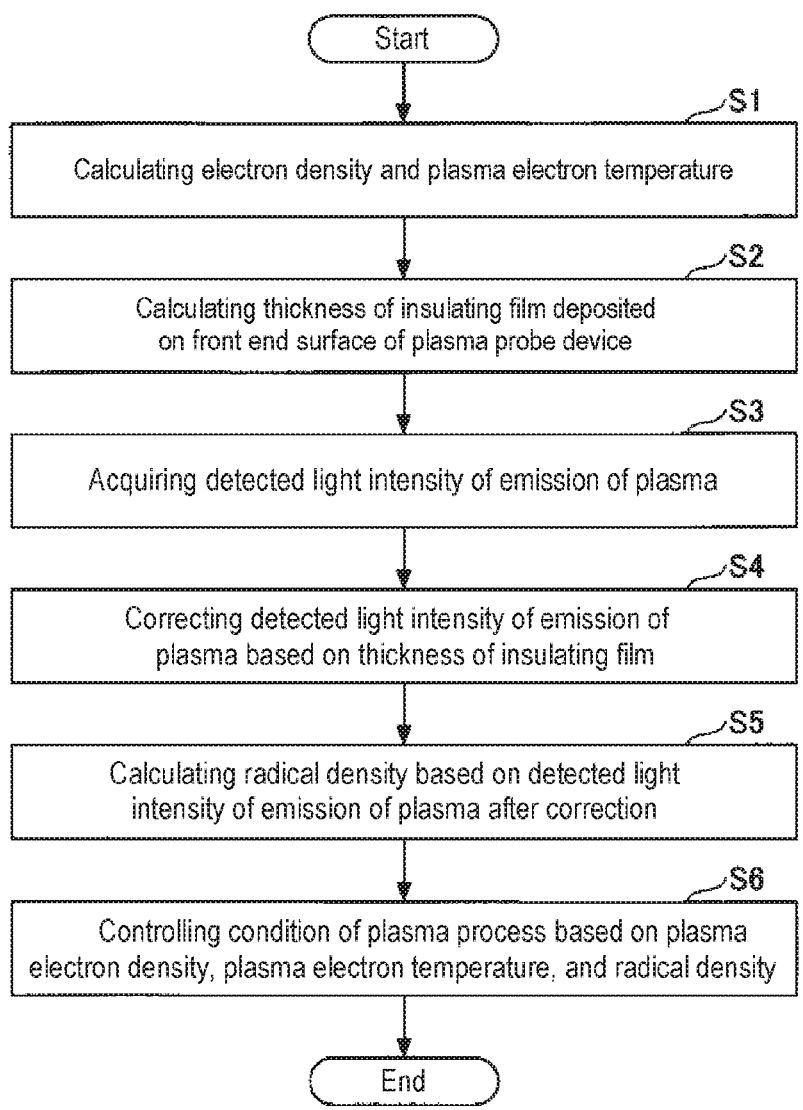

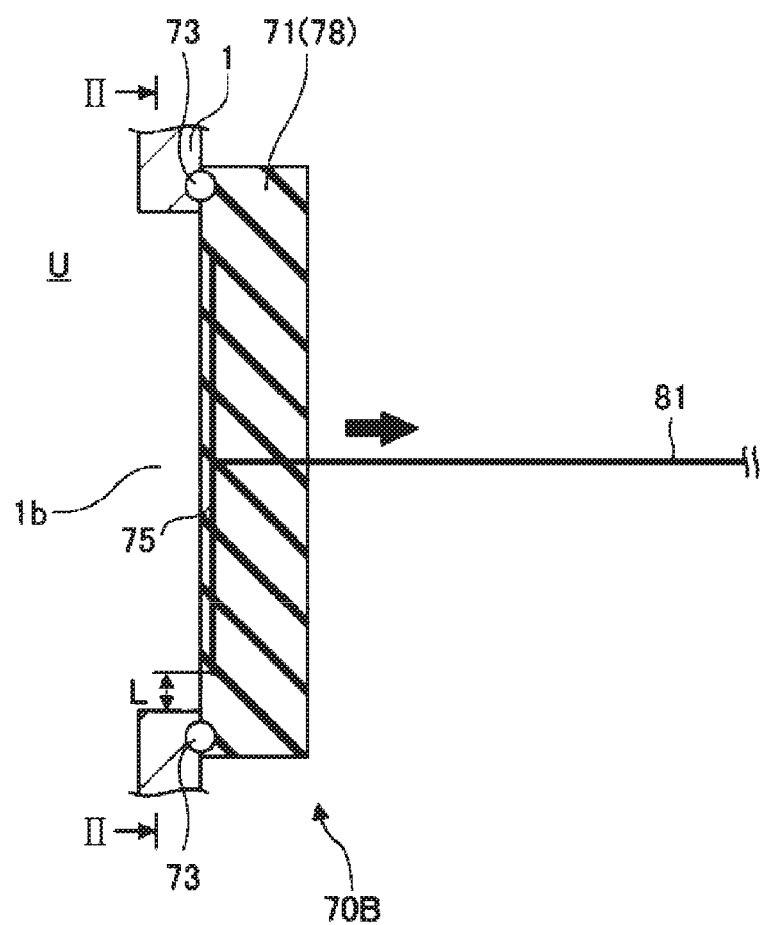

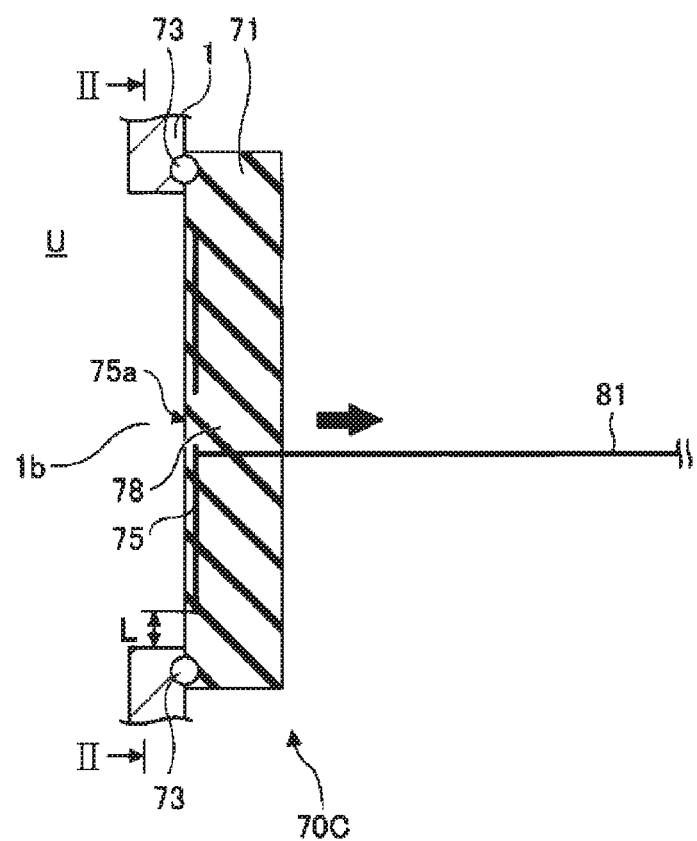

PLASMA PROBE DEVICE, PLASMA PROCESSING APPARATUS, AND CONTROL METHOD

CROSS-REFERENCE TO RELATED APPLICATION

This application is based upon and claims the benefit of priority from Japanese Patent Application No. 2019-162336, filed on Sep. 5, 2019, the entire contents of which are incorporated herein by reference.

TECHNICAL FIELD

The present disclosure relates to a plasma probe device, a plasma processing apparatus, and a control method.

BACKGROUND

Emission spectroscopic analysis is known as one of the methods for monitoring the state of plasma (see, for example, Patent Document 1).

PRIOR ART DOCUMENT

Patent Document

Patent Document 1: Japanese Laid-Open Patent Publication No. 2016-207915

SUMMARY

According to an aspect of the present disclosure, a plasma probe device includes: an antenna installed in an opening portion formed in a wall of a processing container via a seal member that seals between a vacuum space and an atmospheric space; and a light transmission portion installed inside the antenna or forming at least a portion of the antenna, and configured to transmit emission of plasma generated in the vacuum space to the atmospheric space.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIGS. 3A to 3C are views illustrating a plasma probe device of a first configuration example.

FIG. 5 is a view representing an exemplary results of measurement by a plasma probe device.

FIG. 6 is a flowchart illustrating an exemplary feedback control process.

FIGS. 9A and 9B are views illustrating a plasma probe device of a third configuration example.

FIGS. 10A and 10B are views illustrating a plasma probe device of a fourth configuration example.

DETAILED DESCRIPTION

Figure 1:
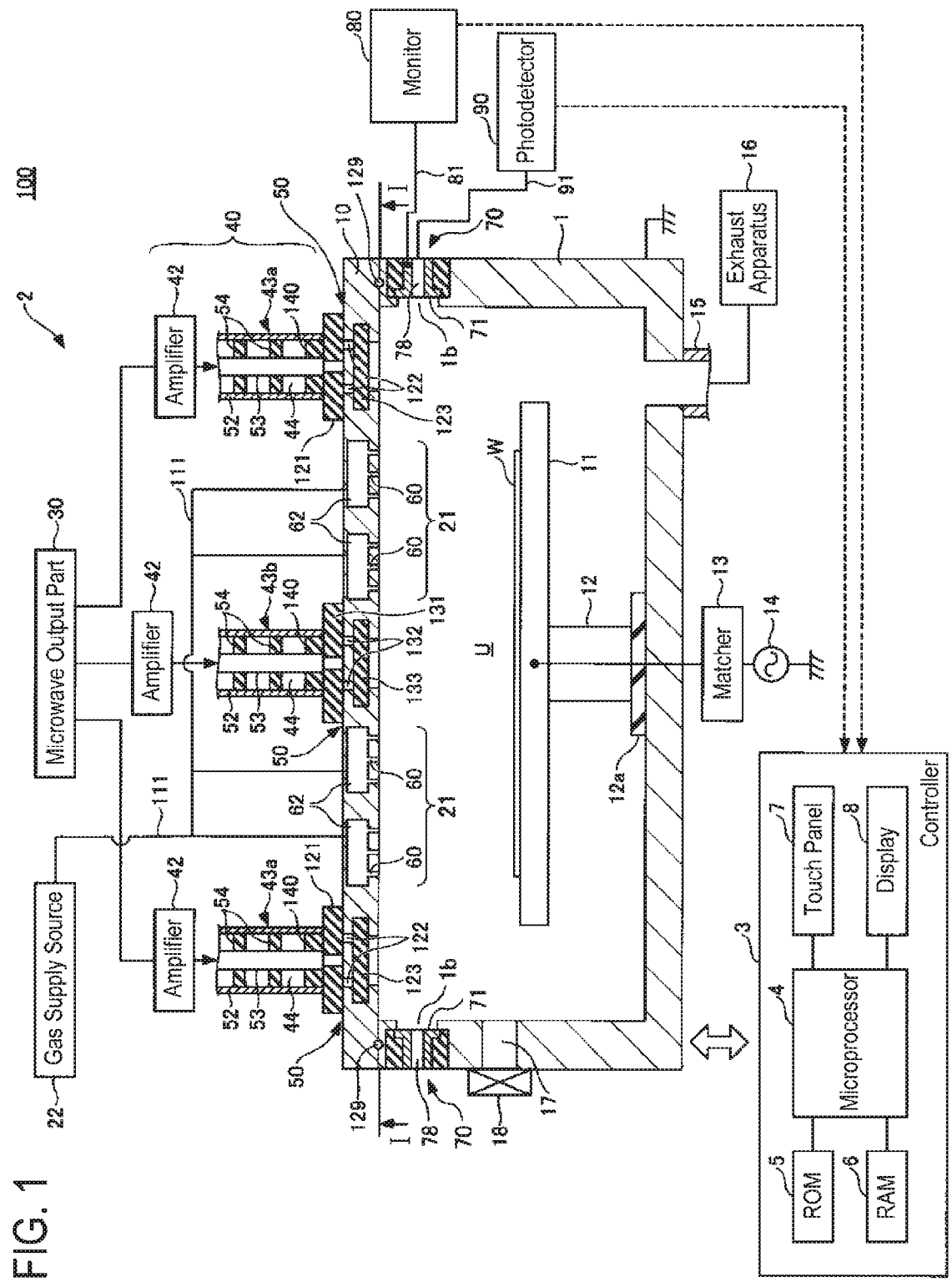
FIG. 1 is a view illustrating an exemplary cross-sectional view of a microwave plasma processing apparatus.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments. In all the accompanying drawings, the same or corresponding members or components will be denoted by the same or corresponding reference numerals, and redundant explanations will be omitted.

[Plasma Process]

In optimizing a plasma process, it is important to monitor not only the plasma electron density and plasma electron temperature, but also radical density, which is directly linked to the process characteristics of a film forming process such as chemical vapor deposition (CVD). Therefore, a method of monitoring a plasma state by optical emission spectroscopy (DES) is used.

However, a film may be deposited on the surface of a transmission part such as a monitor lens for monitoring the emission of plasma during the process, and the emission intensity of plasma may be reduced by the deposited film. Thus, there are cases where it is impossible to accurately monitor the radical density in the plasma generation space.

Therefore, as a result of diligent studies on the above-described problems, the present inventors have found a technique capable of monitoring the radical density in a plasma generation space with high accuracy even during a film forming process. Details will be described below.

[Microwave Plasma Processing Apparatus]

FIG. 1 is a view illustrating an exemplary cross-sectional view of a microwave plasma processing apparatus 100 according to an embodiment. The microwave plasma processing apparatus 100 has a processing container 1 that accommodates a semiconductor wafer (hereinafter referred to as a "wafer W"), which is an example of a substrate. The microwave plasma processing apparatus 100 is an example of a plasma processing apparatus that performs a predetermined plasma process on the wafer W using surface wave plasma formed on the inner wall surface of the ceiling of the processing container 1 by microwaves. Examples of the predetermined plasma process include a film forming process such as CVD.

The microwave plasma processing apparatus 100 includes the processing container 1, a microwave plasma source 2, and a controller 3.

The processing container 1 is a substantially cylindrical container configured to be hermetically sealed and made of a metal material such as aluminum or stainless steel, and is grounded.

The processing container 1 has a main body 10 and forms a plasma processing space therein. The main body 10 is a disc-shaped ceiling plate that constitutes the ceiling of the processing container 1, A support ring 129 is installed in the contact surface between the processing container 1 and the main body 10, whereby the inside of the processing container 1 is hermetically sealed. The main body 10 is formed of a metal material such as aluminum or stainless steel.

The microwave plasma source 2 has a microwave output portion 30, a microwave transmission portion 40, and a microwave radiation mechanism 50. The microwave output portion 30 outputs microwaves and distributes the microwaves into a plurality of paths. The microwaves are introduced into the processing container 1 through the microwave transmission portion 40 and the microwave radiation mechanism 50. A gas supplied into the processing container 1 is excited by an electric field of introduced microwaves, whereby surface wave plasma is formed.

A placement stage 11 on which the wafer W is placed is installed in the processing container 1. The placement stage 11 is supported by a cylindrical support member 12 erected in the center of the bottom portion of the processing container 1 with an insulation member 12a interposed between the bottom portion of the processing container 1 and the support member 12. Examples of the material forming the placement stage 11 and the support member 12 include a metal such as aluminum having an alumite-processed (anodized) surface and an insulation member (e.g., ceramic) having a radio-frequency electrode therein. The placement stage 11 may be provided with, for example, an electrostatic chuck for electrostatically attracting the wafer W, a temperature control mechanism, and a gas flow path for supplying a heat transfer gas to the rear surface of the water W.

A radio-frequency bias power source 14 is connected to the placement stage 11 via a matcher 13. By supplying radio-frequency power to the placement stage 11 from the radio-frequency bias power source 14, the ions in the plasma are drawn to the wafer \V side. The radio-frequency bias power source 14 may not be provided, depending on the characteristics of the plasma process.

An exhaust pipe 15 is connected to the bottom portion of the processing container 1, and an exhaust apparatus 16 including a vacuum pump is connected to the exhaust pipe 15. When the exhaust apparatus 16 is operated, the inside of the processing container 1 is exhausted, whereby the inside of the processing container 1 is quickly depressurized to a predetermined degree of vacuum. The sidewall of the processing container 1 is provided with a loading/unloading port 17 for loading/unloading the wafer W and a gate valve 18 for opening/closing the loading/unloading port 17.

Figure 2:
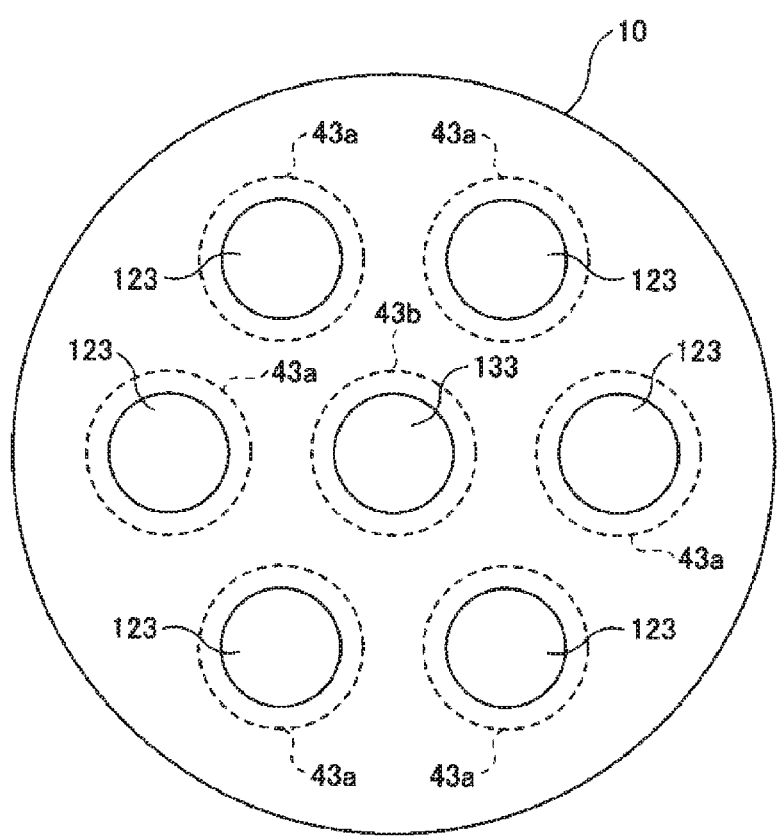
FIG. 2 is a view illustrating an exemplary inner wall of a ceiling of a microwave plasma processing apparatus.

The microwave transmission portion 40 transmits microwaves output from the microwave output portion 30. Referring to FIG. 2 illustrating a cross section taken along line I-I in FIG. 1, a central microwave inlet 43b in the microwave transmission portion 40 is arranged in the center of the main body 10, and six peripheral microwave inlets 43a are arranged in the periphery of the main body 10 at regular intervals in the circumferential direction. The central microwave inlet 43b and the six peripheral microwave inlets 43a have a function of introducing microwaves output from amplifiers 42 (illustrated in FIG. 1) which are provided to correspond thereto, respectively, into the microwave radiation mechanism 50 and a function of matching impedance. Hereinafter, the peripheral microwave inlets 43a and the central microwave inlet 43b are also collectively referred to as microwave inlets 43.

As illustrated in FIGS. 1 and 2, six dielectric layers 123 are arranged inside the main body 10 below the six peripheral microwave inlets 43a. Further, one dielectric layer 133 is arranged inside the main body 10 below the central microwave inlet 43b. The numbers of the peripheral microwave inlets 43a and the dielectric layers 123 are not limited to six, and may be two or more. However, the number of the peripheral microwave inlets 43a and the number of the dielectric layers 123 are preferably three or more, and may be, for example, three to six.

The microwave radiation mechanism 50 illustrated in FIG. 1 has dielectric ceiling plates 121 and 131, slots 122 and 132, and dielectric layers 123 and 133. The dielectric ceiling plates 121 and 131 are made of a disc-shaped dielectric material that transmits microwaves, and are arranged on the top surface of the main body 10. The dielectric ceiling plates 121 and 131 are formed of, for example, quartz, ceramic such as alumina ($Al_2O_3$), a fluorine-based resin such as polytetrafluoroethylene, or a polyimide-based resin having a relative dielectric constant larger than that of vacuum. As a result, the dielectric ceiling plates 121 and 131 have a function of making the wavelengths of the microwaves transmitted therethrough shorter than the wavelengths of the microwaves propagated in the vacuum, thereby reducing the size of an antenna including the slots 122 and 132.

Under the dielectric ceiling plates 121 and 131, the dielectric layers 123 and 133 are in contact with a rear surface of an opening of the main body 10 via the slots 122 and 132 formed in the main body 10. The dielectric layers 123 and 133 are made of, for example, quartz, ceramic such as alumina ($Al_2O_3$), a fluorine-based resin such as polytetrafluoroethylene, or a polyimide-based resin. The dielectric layers 123 and 133 are installed at positions recessed from the ceiling surface by the thickness of the opening formed in the main body 10, and function as dielectric windows for supplying microwaves to a plasma generation space U.

In each of the peripheral microwave inlets 43a and the central microwave inlet 43b, a cylindrical outer conductor 52 and a rod-shaped inner conductor 53 provided at the center thereof are coaxially arranged. Microwave power is supplied between the outer conductor 52 and the inner conductor 53 so as to form a microwave transmission path 44 through which microwaves propagate towards the microwave radiation mechanism 50.

Each of the peripheral microwave inlets 43a and the central microwave inlet 43b is provided with a slug 54 and an impedance adjustment member 140 located at the front end thereof. By moving the slug 54, each microwave inlet has a function of matching the impedance of a load (plasma) in the processing container 1 with the characteristic impedance of a microwave power supply in the microwave output portion 30. The impedance adjustment member 140 is made of a dielectric material, and adjusts the impedance of the microwave transmission path 44 using the relative dielectric constant thereof.

A gas inlet 21 having a shower structure is installed in the main body 10. A gas supplied from the gas supply source 22 passes through the gas supply pipe 111 and passes from the gas diffusion chamber 62 through the gas inlet 21 so as to be supplied into the processing container 1 in the form of a shower. The gas inlet 21 is an example of a gas shower head that supplies gas from a plurality of gas supply holes 60 formed in the ceiling wall of the processing container 1. Examples of the gas include a gas for plasma generation such as Ar gas, a gas to be decomposed with high energy such as $O_2$ gas or $N_2$ gas, and a processing gas such as silane gas.

Each part of the microwave plasma processing apparatus 100 is controlled by the controller 3. The controller 3 has a microprocessor 4, read only memory (ROM) 5, and random accessory memory (RAM) 6. The ROM 5 and the RAM 6 store a process sequence of the microwave plasma processing apparatus 100 and a process recipe as a control parameter. The microprocessor 4 is an example of a controller that controls each part of the microwave plasma processing apparatus 100 based on the process sequence and the process recipe. In addition, the controller 3 has a touch panel 7 and a display 8, and is capable of displaying an input and a result when performing predetermined control according to the process sequence and the process recipe.

When performing the plasma process in the microwave plasma processing apparatus 100, first, the wafer W is loaded into the processing container 1 via the loading/unloading port 17 from the opened gate valve 18 in the state of being held on a transport arm (not illustrated). The gate valve 18 is closed after the wafer W is loaded. When the wafer W is transported to a position above the placement stage 11, the wafer W is transported from the transport arm to a pusher pin (not illustrated), and the pusher pin is lowered so as to place the wafer on the placement stage 11. The pressure inside the processing container 1 is maintained at a predetermined degree of vacuum by the exhaust apparatus 16. A processing gas is introduced into the processing container 1 from the gas inlet 21 in the form of a shower. The microwaves radiated from the microwave radiation mechanism 50 via the peripheral microwave inlets 43a and the central microwave inlet 43b propagate on the inner surface of the ceiling wall. The gas is excited by an electric field of microwaves propagating as surface waves, and a plasma process is performed on the wafer W by surface wave plasma generated in the plasma generation space U under the ceiling wall on the processing container 1 side.

[Plasma Probe Device]

A plurality of opening portions 1b is formed in the circumferential direction in the side wall of the processing container 1, and a plurality of plasma probe devices 70 is attached thereto. However, the number of plasma probe devices 70 attached to the processing container 1 may be one. The plasma probe device 70 senses the plasma generated in the plasma generation space U. The controller 3 calculates, for example, a plasma electron temperature Te, a plasma electron density Ne, a thickness of the deposited film, and a radical density, based on the sensing result by the plasma probe device 70. As a result, it is possible to estimate the behavior of the plasma.

The plasma probe device 70 is connected to a monitor 80 and a photodetector 90 outside the microwave plasma processing apparatus 100.

The monitor 80 has a signal transmitter and outputs a signal of a predetermined frequency transmitted by the signal transmitter. The signal is transmitted via a coaxial cable 81 to be transmitted to the plasma probe device 70, and is transmitted to the plasma from the antenna 71 at the front end of the plasma probe device 70. The plasma probe device 70 detects a current value of a signal reflected from the plasma side with respect to the signal transmitted to the plasma side, and sends the current value to the monitor 80. The current value of the detected signal is transmitted from the monitor 80 to the controller 3, and FFT (frequency) analysis is performed by the microprocessor 4 of the controller 3. As a result, for example, the plasma electron temperature Te, the plasma electron density Ne, and the thickness of the film deposited on the plasma probe device 70 are calculated. The shield of the coaxial cable 81 is grounded or connected to the processing container 1.

The photodetector 90 detects intensity of light emission of the plasma, which is generated in the plasma generation space U, is transmitted via a light transmission portion 78, and is then transmitted via a transmission portion 91 such as an optical fiber. The detected intensity of light emission of plasma is transmitted from the photodetector 90 to the controller 3. The microprocessor 4 of the controller 3 corrects the intensity of light emission of the plasma transmitted from the photodetector 90, based on the calculated thickness of the film deposited on the plasma probe device 70. Further, the microprocessor 4 of the controller 3 calculates the radical density in the plasma generation space U based on the corrected intensity of light emission of plasma. Although the method for calculating the radical density based on the corrected detected intensity of light emission of the plasma is not particularly limited, a known optical emission spectroscopy (OES), for example, can be used.

[Configuration of Plasma Probe Device]

Figure 3B:
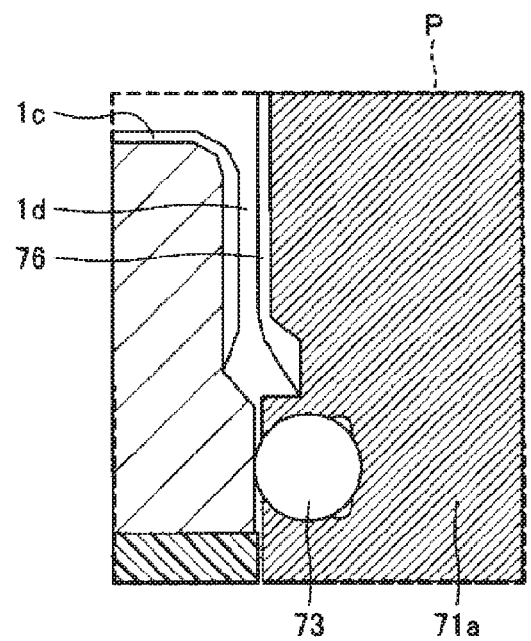
Figure 3C:
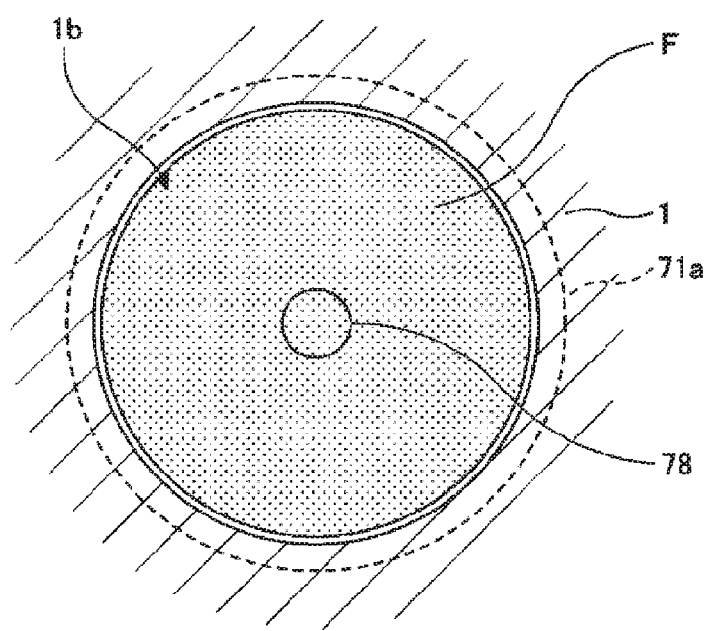

FIGS. 3A to 3C are views illustrating the plasma probe device 70 of a first configuration example. FIG. 3A is a cross-sectional view of the plasma probe device 70, FIG. 3B is an enlarged view of a region P in FIG. 3A, and FIG. 3C is a plan view when the plasma probe device 70 of FIG. 3A is viewed from the plasma generation space U side. FIGS. 3A to 3C illustrate the state in which a film F of a reaction product generated by a plasma process is deposited on the front end surface of the plasma probe device 70.

The plasma probe device 70 includes the antenna 71, an electrode 72, a dielectric support portion 74, and a light transmission portion 78.

The antenna 71 is attached to the opening portion 1b formed in the side wall of the processing container 1 via an O-ring 73. The antenna 71 is provided to include the front end of the plasma probe device 70. In one embodiment, the front end of the antenna 71 is a disc-shaped member 71a, and is disposed so as to cover the opening portion 1b via the O-ring 73. The antenna 71 has a through-hole through which the light transmission portion 78 can be inserted, and is made of a conductor such as aluminum. The O-ring 73 is made of a dielectric material such as a resin. The front end of the antenna 71 is not limited to the disc shape, and may have, for example, a rectangular shape.

The front end surface of the antenna 71 and the rear surface of the wall of the processing container 1 in a vicinity of the opening portion 1b are separated, and a gap 1d having a predetermined width is formed therebetween. When the gap 1d is not formed between the front end surface of the antenna 71 and the wall of the processing container 1 as described above, the antenna 71 is connected to the wall of the processing container 1 in a DC manner. Then, a current of a signal transmitted from the monitor 80 flows through the wall of the processing container 1, and the ratio of current flowing through plasma decreases. As a result, the antenna 71 does not function as the antenna of the plasma probe device 70. For this reason, the front end surface of the antenna 71 and the rear surface of the wall of the processing container 1 in the vicinity of the opening portion 1b form a gap 1d having a predetermined width therebetween. The current of the signal flowing from the antenna 71 to the wall of the processing container 1 is referred to as "floating current."

The antenna 71 functions as the antenna of the plasma probe device 70 even when an AC current flows to the wall side of the processing container 1. However, in order to increase the sensitivity of the plasma probe device 70, it is preferable to prevent a floating current including an AC current as well as a DC current from flowing to the wall side of the processing container 1.

On the other hand, when the gap 1d is too wide, gas or plasma enters the gap 1d, which causes problems of corrosion due to plasma and particles and an abnormal discharge due to infiltration of gas. Therefore, the gap 1d is designed to be a space which is wide enough such that the antenna 71 is not connected to the wall of the processing container 1 in a DC manner, and is narrow enough such that plasma or gas does not enter.

The antenna 71 is disposed at a position recessed from the inner wall surface of the processing container 1 in which the opening portion 1b is formed, and the surface of the antenna 71 is exposed to the plasma generation space U side at the position recessed from the inner wall surface. By forming the surface of the antenna 71 to be recessed, the position where the gap 1d between the antenna 71, which is a generation source of particles, and the wall of the processing container 1 is formed is separated away from the wafer W. As a result, the generation of particles and the infiltration of gas into the plasma probe device 70 can be prevented, the influence of particles on the characteristics of plasma processing can be reduced, and corrosion of the plasma probe device 70 by plasma can be reduced. Further, by forming the surface of the antenna 71 to be recessed from the inner wall surface of the processing container rather than to be the same height as the inner wall surface of the processing container 1, mode jumping of surface wave plasma propagating on the inner wall surface of the processing container 1 is unlikely to occur, and abnormal discharge can be avoided.

In addition, the surface (front end surface) of the antenna 71, at least the region thereof from the opening portion 1b to the O-ring 73, is covered with an insulation film 76 by thermal spraying of yttrium oxide ($Y_2O_3$). Further, the wall surface of the processing container 1, at least the region thereof from the side surface of the opening portion 1b to the O-ring 73 through the rear surface of the opening portion 1b, is covered with the insulation film 1c by thermal spraying of $Y_2O_3$.

This makes it possible to prevent a DC current from flowing from the antenna 71 to the wall side of the processing container 1. In addition, it is possible to improve plasma resistance. Plasma resistance may be further improved by coating the surface of the antenna 71 closer to the atmosphere side than the O-ring 73 and coating the inner wall surface of the processing container 1 with the insulation film 77. The insulation films 76, 77, and 1c may be formed by alumite processing.

The O-ring 73 seals the space between the vacuum space on the opening portion 1b side and the atmospheric space on the side where the plasma probe device 70 is installed. The O-ring 73 is an example of a seal member that seals the space between the vacuum space and the atmospheric space.

As described above, in an embodiment, the O-ring 73 is pressed against the rear surface of the wall of the processing container 1 in a vicinity of the opening portion 1b in the front end surface of the antenna 71 so as to make it difficult for gas to enter the gap between the antenna 71 and the wall of the processing container 1 while sealing the space between the vacuum space and the atmospheric space. This makes it possible to reduce the generation of particles.

Further, if a corrosive gas enters the gap between the antenna 71 and the wall of the processing container 1, the antenna 71 is corroded, and the performance of the plasma probe device 70 is deteriorated. From above, when the plasma probe device 70 is disposed in the opening portion 1b in the processing container 1, vacuum sealing is performed in a vicinity of the opening portion 1b by the O-ring 73 in order to prevent the gas from entering the interior of the plasma probe device 70 as much as possible.

Regarding the size of the opening portion 1b; when the opening portion 1b is widened, a higher ratio of the signal current, transmitted from the monitor 80, flows to the plasma without being turned into a floating current. Thus, the sensitivity of the antenna 71 is improved. On the other hand, when the opening portion 1b is widened, plasma and gas are likely to infiltrate into the antenna 71 side. Thus, there is a possibility that the antenna 71 may be corroded by corrosive gas and plasma, thus deteriorating the performance of the plasma probe device 70 or causing abnormal discharge. In addition, when the sensitivity of the plasma probe device 70 is too high, the measurement results of the plasma probe device 70 are affected by changes in the processing container 1 over time, for example, reaction products generated in the plasma process adhere to the surface of the plasma probe device 70. As a result, the state of plasma may not be accurately measured. Therefore, the opening portion 1b is designed to have an appropriate value within a range within which the state of plasma can be accurately measured in consideration of the sensitivity of the antenna 71 and the infiltration of gas or plasma. The opening portion 1b may have a circular shape, a rectangular shape, or any other shape.

The electrode 72 is connected to the antenna 71. The electrode 72 measures a current value indicating the state of plasma and transmits the current value to the monitor 80 via the coaxial cable 81.

The dielectric support 74 supports the antenna 71 from the surroundings thereof. The dielectric support 74 may be made of, for example, polytetrafluoroethylene (PTFE). The dielectric support 74 surrounds the antenna 71 and fixes the antenna 71 and the O-ring 73. The dielectric support 74 is fixed by screwing a metal member a, such as aluminum, to the wall of the processing container 1 in the state in which the antenna 71 and the O-ring 73 are fixed near the opening portion 1b.

In an embodiment, the dielectric support 74 is separated into two dielectric support portions 74a and 74b. However, the dielectric support 74 is not limited thereto, and the two dielectric support portions 74a and 74b may be integrated. Further, for example, the dielectric support 74 may include only the dielectric support portion 74a that fixes the disc-shaped member 71a of the antenna 71 from the outer peripheral side thereof. In this case, the antenna 71, the dielectric support portion 74a, and the O-ring 73 are fixed by the member 1a. In this case, the dielectric support portion 74b may be a space, or may be filled with PTFE.

The ratio of the length C of the dielectric support 74 in the depth direction to the diameter B of the disc-shaped member 71a of FIG. 3A is about ½, and more specifically, any value in the range of 0.44 to 0.54. When the diameter B and the length C are small or the ratio thereof is not appropriate, the current from the electrode 72 does not reach the plasma through the antenna 71, resulting in poor sensitivity. Accordingly, by setting the diameter B and the length C within a predetermined range, it is possible to provide the plasma probe device 70 having high sensitivity.

In order to improve the sensitivity of the plasma probe device 70, it is necessary to minimize the floating current flowing from the antenna 71 to the wall of the processing container 1. That is, the higher the ratio of the current flowing in the plasma to the floating current, the better the sensitivity of the plasma probe device 70. Therefore, in order to increase the ratio of the current flowing in the plasma to the floating current, it is preferable to increase the surface area of the antenna 71 that is exposed in the opening portion 1b.

Therefore, in an embodiment, at least one of a concave portion and a convex portion may be formed in a region of the front end surface of the antenna 71 which is exposed through the opening portion 1b. Alternatively, the front end surface of the antenna 71 may be curved in a concave shape or a convex shape. This makes it possible to increase the surface area of the antenna 71. As a result, even when the same power signal is transmitted from the monitor 80, the current flowing in the plasma can be increased, and the sensitivity of the plasma probe device 70 can be improved.

The light transmission portion 78 is formed of a cylindrical dielectric material that can be inserted into the through-hole formed in the antenna 71, and is inserted into the through-hole formed in the antenna 71. The light transmission portion 78 is formed of a dielectric material such as sapphire or quartz, which transmits emission of plasma generated in the vacuum space (the plasma generation space U) to the atmospheric space. The emission of plasma that passes through the light transmission portion 78 is transmitted to the photodetector 90 through the transmission portion 91 such as an optical fiber. The front end surface of the light transmission portion 78 is flush with or substantially flush with the front end surface of the antenna 71. As a result, during the plasma process, films having substantially the same thickness are deposited on the front end surface of the antenna 71 and the front end surface of the light transmission portion 78. The light transmission portion 78 is not limited to the cylindrical shape, but is determined depending on the shape of the through-hole formed in the antenna 71. Specifically, when the through-hole formed in the antenna 71 is a prism shape, such as a triangular prism shape or a rectangular prism shape, the light transmission portion 78 is formed in the prism shape, such as the triangular prism shape or the rectangular prism shape. The rear end of the light transmission portion 78 is sealed by an O-ring 79a and a lid 79b.

The O-ring 79a seals the space between the vacuum space on the opening portion 1b side and the atmospheric space on the side where the plasma probe device 70 is installed. The O-ring 79a is made of a dielectric material such as a resin. The O-ring 79a is an example of a second seal member that seals the space between the vacuum space and the atmospheric space.

The lid 79b is installed so as to cover the rear end surface of the light transmission portion 78. The lid 79b seals the vacuum space and the atmospheric space by pressing the O-ring 79a against the rear end surface of the antenna 71 in the state of covering the rear end surface of the light transmission portion 78. This makes it possible to seal the space between the vacuum space and the atmospheric space with a simple structure. The lid 79b may have any size, as long as the lid 79b can cover the gap between t a 71 and the light transmission portion 78. For example, the lid 79b may be larger than the outer diameter of the rear end surface of the light transmission portion 78, and may be smaller than the outer diameter of the rear end surface of the antenna 71. However, the size of the lid 79b may be larger than or equal to the outer diameter of the rear end surface of the antenna 71. The lid 79b is made of a dielectric material, for example, quartz, which transmits the emission of plasma generated in the plasma generation space U to the atmospheric space. As a result, the emission of plasma generated in the plasma generation space U passes through the light transmission portion 78 and the lid 79b, and is transmitted to the photodetector 90 via the transmission portion 91, such as an optical fiber.

[Arrangement of Plasma Probe Devices]

Figure 4:
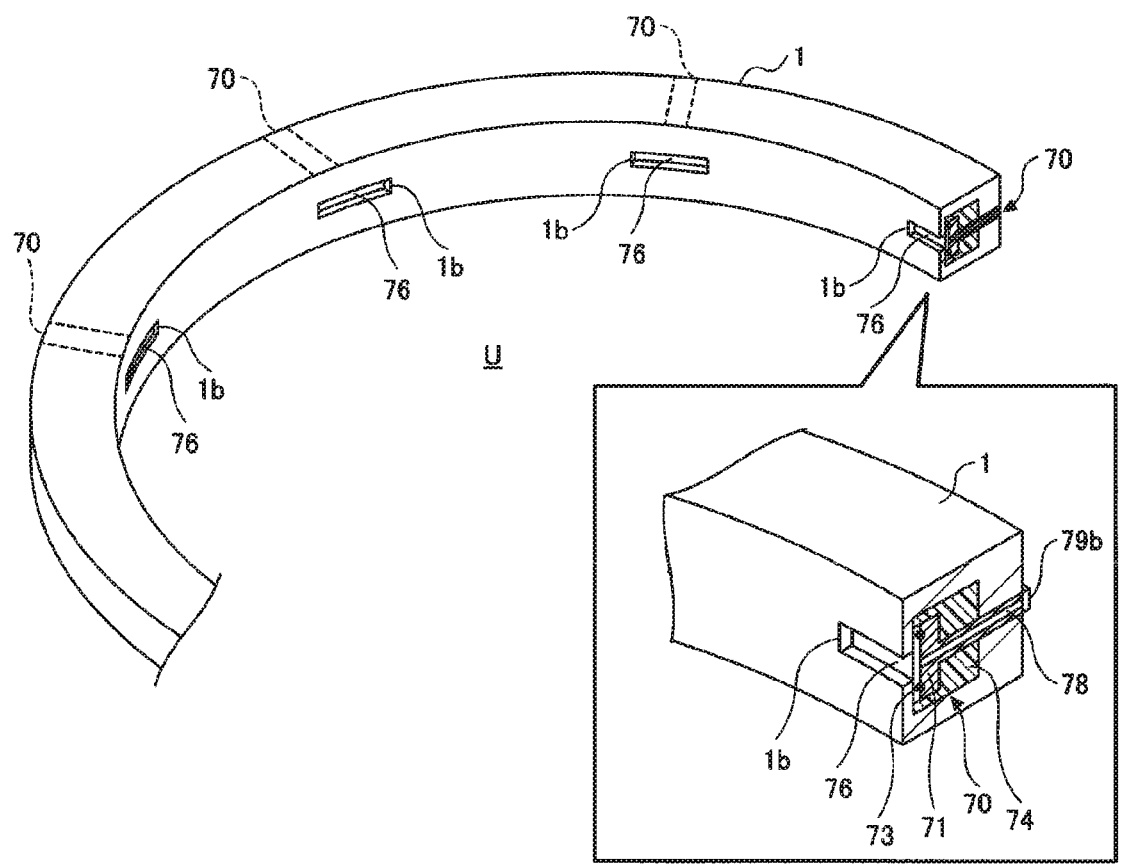
FIG. 4 is a view illustrating an exemplary arrangement of plasma probe devices.

FIG. 4 is a view illustrating an exemplary arrangement of plasma probe devices 70 with respect to the microwave plasma processing apparatus 100 according to an embodiment. In the microwave plasma processing apparatus 100 of the embodiment, a portion of the side wall of the processing container 1 is separated in a ring shape, a plurality of opening portions 1b is formed at regular intervals in a circumferential direction thereof, and the plasma probe device 70 is installed in each of the opening portions 1b via the O-ring 73. The insulation film 76, which is made of $Y_2O_3$ and coated on the antenna 71, is exposed through each of the plurality of opening portions 1b to the plasma generation space U. The opening portions 1b may be a plurality of slits provided in the wall of the processing container 1. The opening portions 1b may be formed in the side wall of the processing container 1 without separating the side wall in the ring shape.

In an embodiment, the plurality of opening portions 1b is provided in the circumferential direction of the side wall of the processing container 1, and the plasma probe device 70 is installed via the O-ring 73 such that the antenna 71 is pressed by the dielectric support 74. However, the member on which the plasma probe devices 70 are arranged is not limited to the side wall of the processing container 1.

For example, a plurality of opening portions 1b may be formed in the circumferential direction, for example, in the ceiling wall of the processing container 1 that is the main body 10, and a plurality of plasma probe devices 70 may be installed in the opening portions 1b, respectively. When each of the plasma probe devices 70 is installed on the ceiling wall, $Al_2O_3$ may be used instead of $Y_2O_3$ for the insulation film coated on the antenna 71.

[Measurement of Plasma Probe Device]

FIG. 5 illustrates exemplary results obtained by measuring the state of plasma generated in the microwave plasma processing apparatus 100 by the plasma probe devices 70 of the embodiment described above. The current values I shown in the graph of the current measurement result on the upper side of FIG. 5 are transmitted from the plasma probe devices 70 to the controller 3 via the monitor 80, and are Fourier-transformed (FFT) by the microprocessor 4 of the controller 3. As a result, as shown in the lower graph of FIG. 5, the current values are transformed into amplitude components for respective frequencies.

In plasma, current flows exponentially for a given voltage. The measured current values include a fundamental wave component having a fundamental frequency, and harmonic wave components, such as a first harmonic wave component having a wavelength that is twice as long as that of the fundamental wave and a second harmonic wave component having a wavelength that is three times as long as the fundamental wave. Therefore, it is possible to calculate a plasma electron density and a plasma electron temperature using the peaks of amplitudes of the fundamental wave and the harmonic wave by FFT. In the graph after FFT, "1ω" indicates the fundamental wave component, "2ω" indicates the first harmonic wave component, and "3ω" indicates the second harmonic wave component.

[Plasma Electron Density $N_e$ and Plasma Electron Temperature $T_e$]

The controller 3 calculates a plasma electron density Ne and a plasma electron temperature $T_e$ using the amplitude of a fundamental wave and a harmonic wave after FFT of the current values measured by each plasma probe device 70. An exemplary calculation method will be briefly described. When an AC current is applied to the electrode 72 of the plasma probe device 70, a probe current $i_{pr}$ represented by Equation 1 flows in the antennas 71.

$$i_{pr} = \frac{1}{4}en_s\bar{u}_e A\exp\left(\frac{V_{Bias} - \Phi_p}{T_e}\right) - en_s u_B A \qquad (1)$$

$$= \frac{1}{4}en_s\bar{u}_e A\exp\left[\frac{(V_{dc} + V_0\cos\omega t) - \Phi_p}{T_e}\right] - en_s u_B A$$

Here, e is an elementary electric charge, $n_s$ is the electron density of a plasma sheath surface, $\bar{u}_e$ is the average speed of electrons, A is the area of an antenna 71 that is in contact with plasma (i.e., the area of an opening portion 1b), $V_{Bias}$ is the voltage applied by a probe, $\Phi_P$ is plasma potential, $T_e$ is the electron temperature of plasma, and $u_B$ is a Bohm speed. Further, $V_{dc}$ is a self-bias voltage, and $V_0$ is the AC voltage (e.g., 4V to 5V) applied from the monitor 80 to the plasma probe device 70.

Equation 1 is transformed using the modified Bessel function of the first kind $I_k$ so as to separate the probe current $i_{pr}$ into a DC component and an AC component, as in Equation 2.

$$i_{pr} = \frac{1}{4}en_s\bar{u}_e A\exp\left(\frac{V_{dc} - \Phi_p}{T_e}\right)I_0\left(\frac{V_0}{T_e}\right) - \qquad (2)$$

$$en_s u_B A + \frac{1}{2}en_s\bar{u}_e A\exp\left(\frac{V_{dc} - \Phi_p}{T_e}\right)\sum_{k=1}^{\infty}I_k\left(\frac{V_0}{T_e}\right)\cos(k\omega t)$$

The upper term on the right side of Equation 2 is the DC component of the probe current $i_{pr}$, and the lower term on the right side of Equation 2 is the AC component of the probe current $i_{pr}$ obtained by multiplying $\cos(k\omega t)$ by a variable. The DC component of the probe current $i_{pr}$ indicates the DC current flowing between the antenna 71 and the plasma. In the configuration of the plasma probe device 70 according to an embodiment, the DC component of the probe current $i_{pr}$ in Equation 2 is set to zero. As a result, Equation 3 is derived.

$$i_{pr} = \frac{1}{2}en_s\bar{u}_e A\exp\left(\frac{V_{dc} - \Phi_p}{T_e}\right)\sum_{k=1}^{\infty}I_k\left(\frac{V_0}{T_e}\right)\cos(k\omega t) \qquad (3)$$

Equation 4 is obtained by expanding Equation 3 by a Fourier series.

$$|i_{1\omega}|/|i_{2\omega}| = I_1\left(\frac{V_0}{T_e}\right)/I_2\left(\frac{V_0}{T_e}\right) \qquad (4)$$

The left side of Equation 4 is an actually measured value, and represents the ratio between the amplitude of the current $i_{1\omega}$ of the fundamental wave 1ω and the amplitude of the current $i_{2\omega}$ of the first harmonic wave 2ω.

The right side of Equation 4 represents the ratio between the fundamental wave and the first harmonic wave in case of expanding the probe current by the modified Bessel function of the first kind.

Therefore, from Equation 4, the plasma electron temperature Te can be calculated from the ratio of the amplitude of the fundamental wave 1ω and the amplitude of the first harmonic wave 2ω calculated by FFT, and the ratio of the actually measured values. $V_0$ is a monitoring voltage (e.g., 4V).

Furthermore, the DC component of the current $i_{1\omega}$ in the fundamental wave 1ω is indicated in Equation 5. Equation 5 equals to zero because it is the DC component of the current $i_{1\omega}$.

$$\frac{1}{4}en_s\bar{u}_e A\exp\left(\frac{V_{dc} - \Phi_p}{T_e}\right)I_0\left(\frac{V_0}{T_e}\right) - en_s u_B A = 0 \qquad (5)$$

The AC component of the current $i_{1\omega}$ is indicated in Equation 6.

$$i_{1\omega} = \frac{1}{2}en_s\bar{u}_e A\exp\left(\frac{V_{dc} - \Phi_p}{T_e}\right)I_1\left(\frac{V_0}{T_e}\right)\cos\omega t \qquad (6)$$

Ion density $n_i$ in the plasma is calculated by substituting the absolute value of the current $i_{1\omega}$ in the fundamental wave 1ω calculated using Equation 6, into Equation 7. The ion density $n_i$ is equal to plasma electron density $N_e$. From the above, the plasma electron density $N_e$ is calculated.

$$n_i = \frac{|i_{1\omega}|}{2(0.61 e u_B A)}\frac{I_0(V_0/T_e)}{I_1(V_0/T_e)} \qquad (7)$$

[Thickness of Deposited Film]

The controller 3 calculates the thickness of a deposited film deposited on the front end surface of the plasma probe device 70 using the amplitude of the fundamental wave after the FFT of the current value measured by the plasma probe device 70. An exemplary calculation method will be briefly described. Since a film adheres to the front end surface of the antenna 71 of a plasma probe device 70 during a plasma process, the waveform of the probe current $i_{pr}$ flowing in the antenna 71 changes, as indicated in Equation 8.

$$\left(\frac{V_0}{|i_{1\omega}|}\right)^2 = \left(\frac{1}{C}\right)^2\left(\frac{1}{\omega}\right)^2 + R_{1\omega}^2 \qquad (8)$$

Here, $V_0$ is an AC voltage applied from the monitor 80 to the plasma probe device 70, $|i_{1\omega}|$ is the amplitude of the current $i_{1\omega}$ of the fundamental wave 1ω, C is the capacitance of the insulation film deposited on the front end surface of the antenna 71, ω is the frequency of the AC voltage applied from the monitor 80 to the plasma probe device 70, and $R^2_{1\omega}$ is an integer.

If the amplitude of the current $i_{1\omega}$ of the fundamental wave 1ω, when the frequency ω of the AC voltage applied from the monitor 80 to the plasma probe device 70 is changed, is obtained and substituted into Equation 8, the electrostatic capacitance C of the insulation film deposited on the front end surface of the antenna 71 can be calculated. Further, Equation 9 is established between the capacitance C of the insulation film and the thickness d of the insulation film.

$$C = \varepsilon\frac{S}{d} \qquad (9)$$

Here, C is the capacitance of the insulation film deposited on the front end surface of the antenna 71, ε is the dielectric constant of the insulation film, S is the area of the insulation film, and d is the thickness of the insulation film.

By substituting the capacitance C of the insulation film calculated using Equation 8 into Equation 9, the thickness d of the insulation film is calculated.

As described above, since a film adheres to the front end surface of the antenna 71 during a plasma process, the waveform of the current flowing in the antenna 71 measured by the monitor 80 changes. Accordingly, the controller 3 of the microwave plasma processing apparatus 100 of the present disclosure may estimate the thickness of the film adhering to the front end surface of the antenna 71 (light transmission portion 78) by analyzing the change in the intensity of the signal acquired from the monitor 80.

[Feedback Control Process]

An exemplary process of feedback-controlling the plasma processing conditions of the microwave plasma processing apparatus 100 using the plasma probe device 70 according to the embodiment (hereinafter, referred to as a "feedback control process") will be described.

FIG. 6 is a flowchart illustrating an exemplary feedback control process. The feedback control process illustrated in FIG. 6 is executed during a plasma process performed using, for example, the microwave plasma processing apparatus 100.

First, the controller 3 calculates a plasma electron density $N_e$ and a plasma electron temperature $T_e$ using the amplitudes of a fundamental wave and a harmonic wave after FFT of current values measured by the plasma probe device 70 (step S1).

Subsequently, the controller 3 calculates the thickness d of an insulation film deposited on the front end surface of the plasma probe device 70 using the amplitude of the fundamental wave after FFT of the current value measured by the plasma probe device 70 (step S2).

Subsequently, the controller 3 acquires the emission intensity of plasma detected by the photodetector 90 (hereinafter, also referred to as "detected light intensity") (step S3).

Subsequently, the controller 3 corrects the detected light intensity of emission of plasma obtained in step S3, based on the thickness of the insulation film deposited on the front end surface of the plasma probe device 70 and calculated in step S2 (step S4).

Figure 7A:
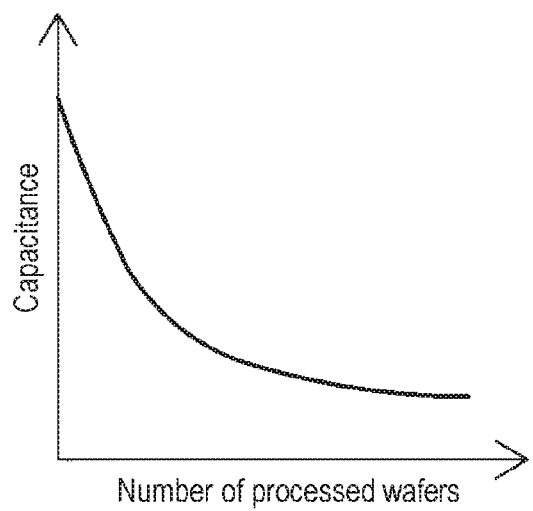
FIGS. 7A to 7D are views for explaining a feedback control process.
Figure 7B:
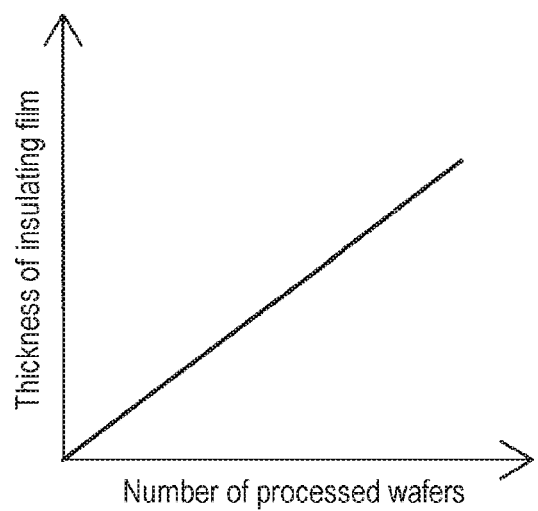
Figure 7C:
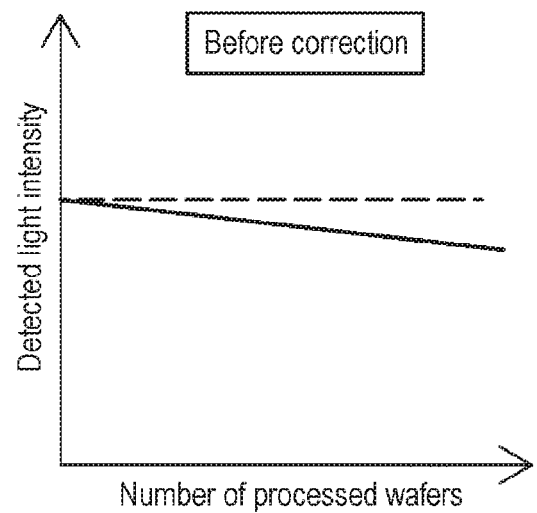
Figure 7D:
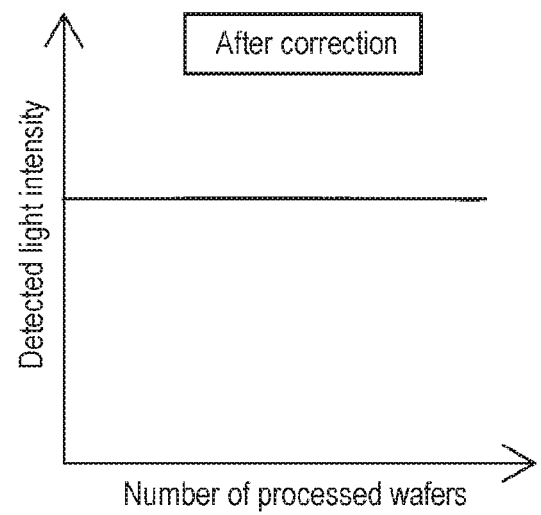

Here; correction of the detected light intensity of emission of plasma will be described with reference to FIGS. 7A to 7D. FIGS. 7A to 7D are views for explaining a feedback control process. FIG. 7A shows a relationship between the number of wafers W processed by the microwave plasma processing apparatus 100 (hereinafter referred to as "number of processed wafers") and the capacitance of an insulation film deposited on the front end surface of the plasma probe device 70. FIG. 7B shows a relationship between the number of processed wafers and the thickness of an insulation film deposited on the front end surface of the plasma probe device 70. FIG. 7C shows a relationship between the number of processed wafers and the detected light intensity of emission of plasma (before correction) detected by the photodetector 90. FIG. 7D shows a relationship between the number of processed wafers and the detected light intensity (after correction) of emission of plasma by the photodetector 90. In FIG. 7C, for comparison, a broken line indicates the detected light intensity of emission of plasma when no insulation film is deposited on the front end surface of the plasma probe device 70.

As the number of processed wafers increases, the capacitance of the insulation film decreases in inverse proportion to the number of processed wafers, for example, as shown in FIG. 7A, and the thickness of the insulation film deposited on the front end surface of the plasma probe device 70 increases in proportion to the number of processed wafers, as shown in FIG. 7B. When the thickness of the insulation film deposited on the front end surface of the plasma probe device 70 increases, the emission of plasma generated in the plasma generation space U and incident on the light transmission portion 78 is partially reflected or absorbed by the insulation film. Therefore, for example, as shown in FIG. 7C, the detected light intensity of emission of plasma detected by the photodetector 90 decreases in proportion to the increase in the number of processed wafers. That is, the detected light intensity of emission of plasma detected by the photodetector 90 becomes smaller than the emission intensity of plasma in the plasma generation space U. As a result, the emission intensity of plasma in the plasma generation space U cannot be detected accurately.

Therefore, in an embodiment, the controller 3 corrects the detected light intensity of emission of plasma acquired in step S3, based on the thickness of the insulation film calculated in step S2 and the relationship information in which the thickness of the insulation film and the attenuation rate of emission of plasma are associated with each other. As a result, as shown in FIG. 7D, the emission intensity of plasma in the plasma generation space U can be accurately detected even when the number of processed wafers increases. The relationship information in which the thickness of an insulation film and an attenuation rate of emission of plasma are associated with each other is calculated through, for example, a preliminary experiment for each type of insulation film and each type of gas supplied into the processing container 1 during a plasma process, and is stored in ROM 5 and RAM 6 of the controller 3 as an equation and a table. However, the relationship information in which the thickness of the insulation film and the attenuation rate of emission of plasma are associated with each other may be stored in a storage device different from the controller 3, as long as the microprocessor 4 can access the relationship information.

Subsequently, the controller 3 calculates a radical density based on the detected light intensity of emission of plasma corrected in step S4 (step S5). This allows the radical density of the plasma generation space U to be accurately monitored during the plasma process.

Subsequently, the controller 3 controls the conditions of the plasma process based on at least one of the plasma electron density and the plasma electron temperature calculated in step S1 and the radical density calculated in step S5 (step S6).

For example, the controller 3 controls the power of microwaves introduced into the processing container 1 from the peripheral microwave inlets 43*a* and the central microwave inlet 43*b* in real time during the plasma process depending on the plasma electron density, the plasma electron temperature, and the radical density. Specifically, the controller 3 controls amplifiers 42 that respectively output microwaves to the peripheral microwave inlets 43*a* and the central microwave inlet 43*h* depending on the plasma electron density, the plasma electron temperature, and the radical density. Thus, the plasma state can be changed by adjusting the plasma intensity of microwaves introduced into the corresponding peripheral microwave inlets 43*a* and the central microwave inlet 43*b*.

Further, for example, the controller 3 controls the phase of microwaves propagating through the peripheral microwave inlets 43*a* and the central microwave inlet 43*b* in real time during the plasma process depending on the plasma electron density, the plasma electron temperature, and the radical density. Specifically, the controller 3 controls amplifiers 42 that respectively output microwaves to the peripheral microwave inlets 43a and the central microwave inlet 43b depending on the plasma electron density, the plasma electron temperature, and the radical density, and changes the phase of the microwaves so as to modulate radiation characteristics. This makes it possible to change the state of plasma by adjusting the phase of the microwaves introduced into the peripheral microwave inlets 43a and the central microwave inlet 43b so as to control the directivity of the microwaves.

In the example shown in FIG. 6, the case in which the controller 3 executes step S1, step S2, and step S3 in this order has been described, but the present disclosure is not limited thereto. For example, the order of steps S1 to S3 may be changed, or at least two of steps S1 to S3 may be executed simultaneously.

[Modification of Configuration of Plasma Probe Device]

Figure 8:
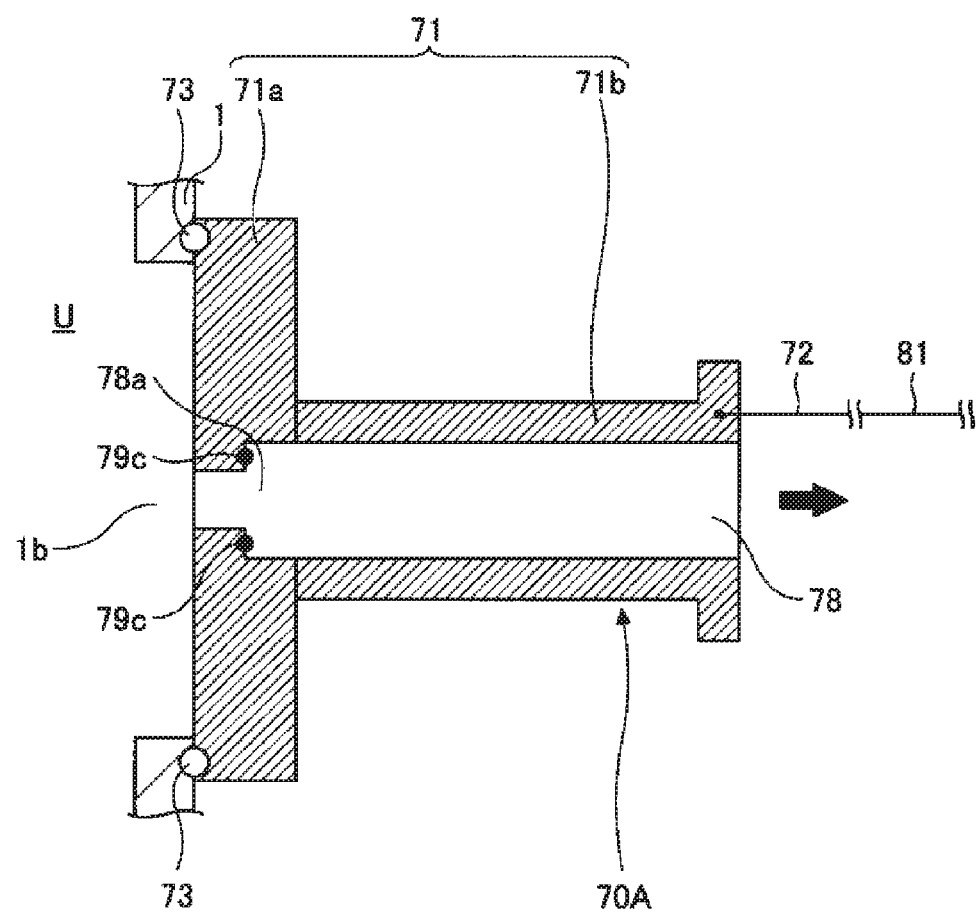
FIG. 8 is a view illustrating a plasma probe device of a second configuration example.

FIG. 8 is a view illustrating a plasma probe device 70A of a second configuration example. As illustrated in FIG. 8, the plasma probe device 70A is different from the plasma probe device 70 of the first configuration example in that the front end side of the light transmission portion 78 is sealed by an O-ring 79c. Hereinafter, differences from the plasma probe device 70 will be mainly described.

The plasma probe device 704 includes an antenna 71, an electrode 72, and a light transmission portion 78.

The antenna 71 has a disc-shaped member 71a at the front end and a tubular member 71b fixed to the atmospheric space side of the disc-shaped member 71a, and the disc-shaped member 71a is installed in an opening portion 1b formed in the sidewall of the processing container 1 via an O-ring 73. The disc-shaped member 71a and the tubular member 71b have through-holes through which the light transmission portion 78 can be inserted, and are formed of a conductor such as aluminum. The disc-shaped member 71a and the tubular member 71h may be integrally formed.

The electrode 72 is connected to the tubular member 71b of the antenna 71, measures a current value indicating the state of plasma, and transmits the current value to the monitor 80 via a coaxial cable 81.

The light transmission portion 78 is formed of a cylindrical dielectric material that can be inserted into the through-hole formed in the antenna 71, and is inserted into the through-hole formed in the antenna 71. The light transmission portion 78 is formed of a dielectric material such as sapphire or quartz that transmits emission of plasma generated in the vacuum space (the plasma generation space U) to the atmospheric space. The emission of plasma that passes through the light transmission portion 78 is transmitted to the photodetector 90 through the transmission portion 91, such as an optical fiber. The front end surface of the light transmission portion 78 is flush with or substantially flush with the front end surface of the antenna 71. As a result, during the plasma process, films having substantially the same thickness are deposited on the front end surface of the antenna 71 and the front end surface of the light transmission portion 78. The front end of the light transmission portion 78 has a convex portion 78a. By fitting the convex portion 78a of the light transmission portion 78 into a concave portion formed in the disc-shaped member 71a and pressing the O-ring 79c therebetween, the space between the vacuum space and the atmosphere space can be sealed. The O-ring 79c is made of a dielectric material such as a resin. The O-ring 79c is an example of a second seal member that seals the space between the vacuum space and the atmospheric space.

Figure 9B:
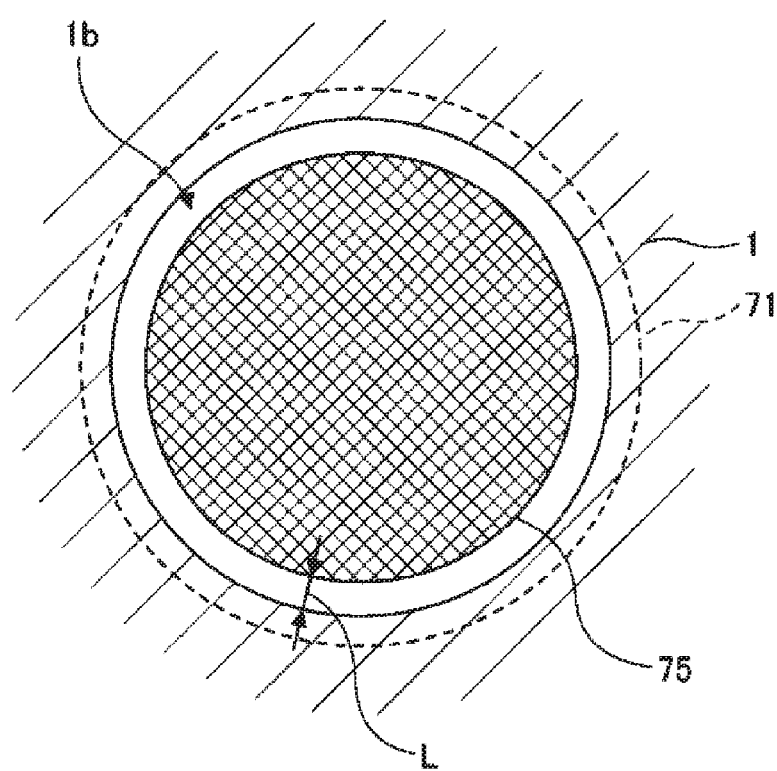

FIGS. 9A and 9B are views illustrating a plasma probe device 70B of a third configuration example. FIG. 9A is a cross-sectional view of the plasma probe device 70B, and FIG. 93 is a view taken along the line II-II in FIG. 9A. As illustrated in FIGS. 9A and 93, the plasma probe device 703 is different from the plasma probe device 70 of the first configuration example in that the antenna 71 is formed of a dielectric material that transmits emission of plasma, the electrode 75 is embedded inside, and the light transmission portion 78 is a portion of the antenna 71. Hereinafter, differences from the plasma probe device 70 will be mainly described.

The plasma probe device 70B includes an antenna 71, an electrode 75, and a light transmission portion 78.

The antenna 71 is installed in an opening portion 1b formed in the side wall of the processing container 1 via an O-ring 73. The antenna 71 is made of a disc-shaped dielectric material that transmits emission of plasma, such as sapphire or quartz, and has an electrode 75 embedded therein.

The electrode 75 is embedded in the antenna 71. The electrode 75 measures a current value indicating the state of plasma and transmits the current value to the monitor 80 via a coaxial cable 81. The electrode 75 is formed in, for example, a mesh shape. As a result, since the area of the electrode 75 is increased, the measurement sensitivity of the plasma probe device 70B is improved. In addition, since the mesh-shaped electrode 75 transmits the emission of plasma, it is possible to transmit the emission of plasma generated in the plasma generation space U to the atmospheric space even if no opening portion is provided in the electrode 75. Therefore, the area of the electrode 75 can be maximized.

The light transmission portion 78 is a portion of the antenna 71, and transmits the emission of plasma generated in the plasma generation space U to the atmospheric space. The emission of plasma that passes through the light transmission portion 78 is transmitted to the photodetector 90 through the transmission portion 91, such as an optical fiber.

In the plasma probe device 70B of the third configuration example, the antenna 71 is formed of a dielectric material, and the electrode 75 is embedded in the antenna 71 in a vicinity of the front end surface of the antenna 71 exposed through the opening portion 1b such that the antenna 71 is not exposed. As a result, since the electrode 75 is not exposed through the opening portion 1b, contamination can be prevented.

In addition, in the plasma probe device 70B of the third configuration example, no gap is provided between the side wall of the processing container 1 in which the O-ring 73 is arranged and the antenna 71. This is because the sidewall of the processing container 1 is a conductor and the antenna 71 is a dielectric, and thus the two members are not electrically connected. Therefore, it is possible to create the state in which the sidewall of the processing container 1 and the antenna 71 are not electrically connected to each other even if no gap is provided. This makes it possible to set a floating current leaking from the vicinity of the O-ring 73 to substantially zero, and to improve the measurement sensitivity and accuracy of the plasma probe device 70B.

Further, with the plasma probe device 70B of the third configuration example, since the antenna 71 functions as the light transmission portion 78, it is not necessary to separately provide the light transmission portion 78. Therefore, the structure of the plasma probe device 70B is simple.

In addition, in order to increase the measurement sensitivity of the plasma probe device 70B, the area of the electrode 75 may be as large as possible. Meanwhile, in order to obtain a predetermined probe characteristic, the electrode 75 and the metal on the side wall of the processing container 1 may not overlap with each other. Therefore, as illustrated in FIG. 9B, the electrode 75 may be formed in a circular shape such that the distance L from the edge of the opening portion 1b is about 2 to 3 mm.

Figure 10B:
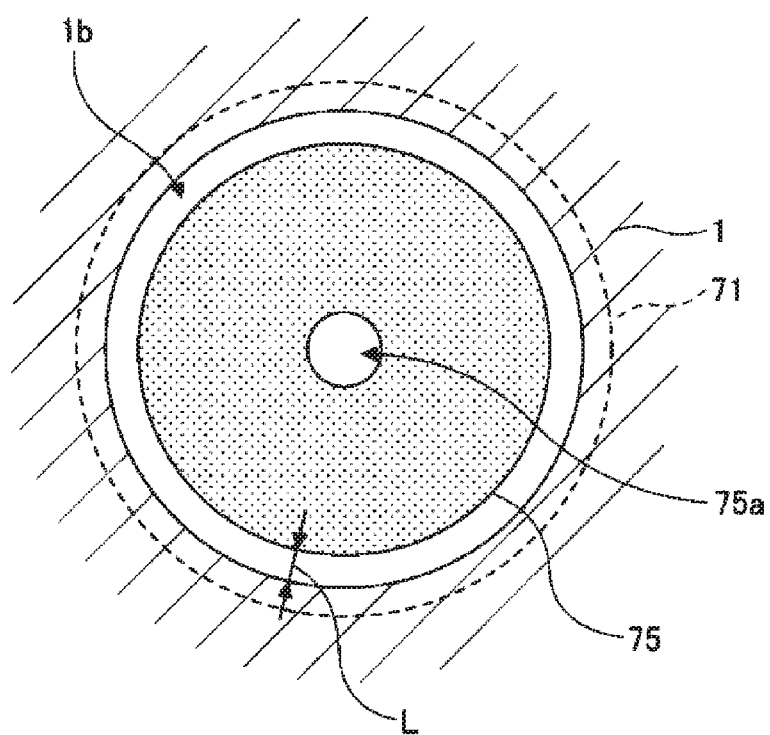

FIGS. 10A and 10B are views illustrating a plasma probe device 70C of a fourth configuration example. FIG. 10A is a cross-sectional view of the plasma probe device 70C, and FIG. 10B is a view taken along the line II-II in FIG. 10A. As illustrated in FIGS. 10A and 10B, the plasma probe device 70C is different from the plasma probe device 70B of the third configuration example in that the electrode 75 is formed in the shape of a plate or a film having an opening portion 75a therein. Hereinafter, differences from the plasma probe device 70B will be mainly described.

The plasma probe device 70C includes an antenna 71, an electrode 75, and a light transmission portion 78.

The antenna 71 is installed in an opening portion 1b formed in the side wall of the processing container 1 via an O-ring 73. The antenna 71 is made of a disc-shaped dielectric material that transmits emission of plasma, such as sapphire or quartz, and has an electrode 75 embedded therein.

The electrode 75 is embedded in the antenna 71. The electrode 75 measures a current value indicating the state of the plasma and transmits the current value to the monitor 80 via a coaxial cable 81. The electrode 75 is formed in, for example, a plate shape or a film shape. When the electrode 75 is formed in a plate shape or a film shape, an opening portion 75a may be formed in the electrode 75 from the viewpoint of preventing emission of plasma that passes through the antenna 71 from being attenuated by the electrode 75.

The light transmission portion 78 is a portion of the antenna 71, and transmits the emission of plasma generated in the plasma generation space U to the atmospheric space. The emission of plasma that passes through the light transmission portion 78 is transmitted to the photodetector 90 via the transmission portion 91, such as an optical fiber.

In the plasma probe device 70C of the fourth configuration example, the antenna 71 is formed of a dielectric material, and the electrode 75 is embedded in the antenna 71 in a vicinity of the front end surface of the antenna 71 exposed through the opening portion 1b such that the electrode 75 is not exposed. As a result, since the electrode 75 is not exposed through the opening portion 1b, the occurrence of contamination can be prevented.

In addition, in the plasma probe device 70C of the fourth configuration example, no gap is provided between the side wall of the processing container 1 in which the O-ring 73 is arranged and the antenna 71. This is because the side wall of the processing container 1 is a conductor and the antenna 71 is a dielectric, and thus the two members are not electrically connected. Therefore, it is possible to create the state in which the side wall of the processing container 1 and the antenna 71 are not electrically connected to each other even if no gap is provided. This makes it possible to set a floating current leaking from the vicinity of the O-ring 73 to substantially zero, and to improve the measurement sensitivity and accuracy of the plasma probe device 70C.

Further, according to the plasma probe device 70C of the fourth configuration example, since the antenna 71 functions as the light transmission portion 78, it is not necessary to separately provide the light transmission portion 78. Therefore, the structure of the plasma probe device 70C is simple.

In addition, in order to increase the measurement sensitivity of the plasma probe device 70C, the area of the electrode 75 may be as large as possible. On the other hand, in order to obtain a predetermined probe characteristic, the electrode 75 and the metal on the side wall of the processing container 1 may not overlap with each other. Therefore, as illustrated in FIG. 10B, the electrode 75 may be formed in a circular shape such that the distance L from the edge of the opening portion 1b is about 2 to 3 mm.

It should be understood that the embodiments disclosed herein are illustrative and are not limiting in all aspects. The above-described embodiments may be omitted, replaced, or modified in various forms without departing from the scope and spirit of the appended claims.

In the above embodiments, the plasma processing apparatus using microwaves has been described as an example of the plasma processing apparatus, but the present disclosure is not limited thereto. The plasma processing apparatus may be, for example, a capacitively coupled plasma (CCP) apparatus, an inductively coupled plasma (ICP) apparatus, a plasma processing apparatus using a radial line slot antenna, a helicon wave excited plasma (IMP) apparatus, or an electron cyclotron resonance plasma (ECR) apparatus.

In the above embodiments, a semiconductor wafer has been described as an example of a substrate, but the present disclosure is not limited thereto. The substrate may be, for example, a large substrate for a flat panel display (FPD), an EL element, or a substrate for a solar cell.

According to the present disclosure, it is possible to monitor radical density in a plasma generation space with high accuracy.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A plasma probe device comprising:
an antenna installed in an opening portion formed in a wall of a processing container via a seal member that seals between a vacuum space and an atmospheric space; and
a light transmission portion formed of a dielectric material, installed inside the antenna or forming at least a portion of the antenna, and configured to transmit light emission of plasma generated in the vacuum space to the atmospheric space,
wherein the antenna is formed of a conductor having a through-hole through which the light transmission portion is capable of being inserted,
wherein the light transmission portion is inserted through the through-hole, and
wherein the light transmission portion is installed in the antenna via a second seal member that seals between the vacuum space and the atmospheric space.

2. The plasma probe device of claim 1, wherein the second seal member is installed at least in a side of the light transmission portion near the atmospheric space.

3. The plasma probe device of claim 2, wherein the light transmission portion has a cylindrical shape.

4. The plasma probe device of claim 3, wherein the dielectric material is quartz.

5. The plasma probe device of claim 4, further comprising:
a dielectric support formed of a dielectric material and supporting the antenna from surroundings of the antenna.

6. The plasma probe device of claim 5, wherein facing surfaces of the antenna and the wall are spaced apart from each other by a predetermined width, and a surface of the antenna exposed through the opening portion is more recessed than a surface of the wall, in which the opening portion is formed, on a side of the vacuum space.

7. The plasma probe device of claim 6, further comprising a controller configured to: correct an emission intensity of the plasma that passes through the light transmission portion during a plasma process based on a thickness of a film deposited on a surface of the antenna on a side of the vacuum space and detected by the antenna; and control a condition of the plasma process based on the corrected emission intensity of the plasma.

8. The plasma probe device of claim 1, wherein the second seal member is installed at least in a side of the light transmission portion near the vacuum space.

9. The plasma probe device of claim 1, wherein the light transmission portion has a cylindrical shape.

10. The plasma probe device of claim 1, further comprising:
a dielectric support formed of a dielectric material and supporting the antenna from surroundings of the antenna.

11. The plasma probe device of claim 1, wherein facing surfaces of the antenna and the wall are spaced apart from each other by a predetermined width, and a surface of the antenna exposed through the opening portion is more recessed than a surface of the wall, in which the opening portion is formed, on a side of the vacuum space.

12. The plasma probe device of claim 1, further comprising a controller configured to: correct an emission intensity of the plasma that passes through the light transmission portion during a plasma process based on a thickness of a film deposited on a surface of the antenna on a side of the vacuum space and detected by the antenna; and control a condition of the plasma process based on the corrected emission intensity of the plasma.

13. The plasma probe device of claim 12, wherein the controller is configured to control the condition of the plasma process based on at least one of a plasma electron density and a plasma electron temperature detected by the antenna.

* * * * *